(12) United States Patent
Kim

(10) Patent No.: US 7,476,973 B2
(45) Date of Patent: Jan. 13, 2009

(54) METHOD OF MANUFACTURING A SEMICONDUCTOR DEVICE HAVING A SILICIDATION BLOCKING LAYER

(75) Inventor: Hyeon-Cheol Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/754,248

(22) Filed: May 25, 2007

(65) Prior Publication Data

US 2007/0252279 A1    Nov. 1, 2007

Related U.S. Application Data

(62) Division of application No. 10/770,622, filed on Feb. 2, 2004, now Pat. No. 7,235,481.

(30) Foreign Application Priority Data

Jan. 3, 2003  (KR) .................. 2003-6592

(51) Int. Cl.
*H01L 29/41* (2006.01)
(52) U.S. Cl. ................ 257/773; 257/384; 257/E29.136
(58) Field of Classification Search ........... 257/773
See application file for complete search history.

(56) References Cited

U.S. PATENT DOCUMENTS

| 5,589,423 A * | 12/1996 | White et al. ............... 438/586 |
| 6,015,748 A | 1/2000 | Kim et al. |
| 6,326,669 B1 | 12/2001 | Hwang et al. |
| 6,339,018 B1 | 1/2002 | Ballantine et al. |
| 6,583,042 B2 | 6/2003 | Manning |

* cited by examiner

*Primary Examiner*—Jerome Jackson, Jr.
(74) *Attorney, Agent, or Firm*—Marger Johnson & McCollom, P.C.

(57) ABSTRACT

A silicidation blocking layer (SBL) pattern is formed on a substrate including an active region and a field region. The SBL pattern covers the field region and exposes the active region. A silicide layer is formed on the active region by reacting metal with silicon existing in the active region. An insulation layer is formed on the substrate including the silicide layer. An opening exposing the silicide layer is formed by selectively etching the insulation layer under a condition having an etching selectivity between the SBL and the insulation layer. Conductive material is filled up the opening. The field region of a substrate is sufficiently protected by the SBL pattern without any additional process so that the failure of a semiconductor device is effectively prevented because the flow of a leakage current through the field region is blocked.

12 Claims, 6 Drawing Sheets

METHOD OF MANUFACTURING A SEMICONDUCTOR DEVICE HAVING A SILICIDATION BLOCKING LAYER

CROSS REFERENCE TO RELATED APPLICATIONS

This application is a divisional of U.S. patent application Ser. No. 10/770,622, filed on Feb. 2, 2004, now pending, which claims priority under 35 U.S.C. § 119 to Korean Patent Application No. 2003-6592, filed on Feb. 3, 2003, the contents of which are herein incorporated by reference in their entirety for all purposes.

BACKGROUND OF THE INVENTION

1. Field of the Invention

The present invention relates to semiconductor devices, and more particularly to a method of manufacturing a semiconductor substrate including a contact having an improved structure and to devices manufactured by such a method.

2. Description of the Related Art

Modern semiconductor devices must have advanced functions such as high response speed and large storage capacity. To meet these functional requirements, semiconductor manufacturing technology has been developed to produce semiconductor devices with highly integrated cells on a chip. The wirings of such semiconductor devices generally are multi-layered structures.

In highly integrated semiconductor devices, contacts are provided to connect the multi-layered wirings. To form such contacts, a contact hole having minimized critical dimension (CD) is formed through an interlayer insulation film formed between an upper wiring and a lower wiring. A conductive material is formed in the contact hole, thereby forming the contact that connects the lower wiring to the upper wiring.

In the process for forming the contact hole through the interlayer dielectric film, a photoresist film is formed on the interlayer insulation film. The photoresist film is exposed and developed to form a photoresist pattern on the interlayer insulation film. The photoresist pattern exposes the portion of the interlayer insulation film where the contact hole will be formed. The exposed portion of the interlayer insulation film is etched using the photoresist pattern as an etching mask, thereby forming the contact hole through the interlayer insulation film. The size of the contact hole becomes minute when the design rule for the semiconductor device is greatly reduced. Thus, the error margin of the photo mask used to form the contact hole considerably decreases in the exposing and developing processes for the photoresist film. As a result, the mis-alignment of the contact hole may very frequently occur during the formation of the contact hole. For example, although the contact hole should be located in the active region of a semiconductor substrate adjacent to a field region of the substrate, the contact hole may be frequently formed in the field region.

A silicide film can be selectively formed on a semiconductor substrate to improve the response speed of the semiconductor device. This silicide film includes a refractory metal having a low specific resistance so that the contact resistance of a contact formed on the silicide film is low even though the contact has a minute dimension in accordance with the reduction of the design rule of the semiconductor device.

The silicide film is generally formed using a silicidation process employing a metal such as titanium (Ti), nickel (Ni), cobalt (Co), etc. After this metal is deposited on an underlying film including silicon, the deposited metal is thermally treated to thereby form the silicide film composed of titanium silicide ($TiSi_2$), nickel silicide ($NiSi_2$), cobalt silicide ($CoSi_2$), etc. on the underlying film. The silicidation process is, for example, disclosed in U.S. Pat. No. 6,015,748 (issued to Kim, et. al.). The cobalt silicide or nickel silicide has a relatively low specific resistance of about 15 to about 20 $\mu\Omega\cdot cm$. In a semiconductor device having a design rule of below about 0.25 μm, the cobalt silicide is mainly employed since a cobalt silicide film is relatively independent on the critical dimension of a gate structure.

To selectively form the silicide film on the semiconductor substrate, a silicidation blocking layer (SBL) is formed on portions of the substrate or other conductive structures where the silicide film is not formed. That is, the SBL is selectively formed on the portions of the substrate and the conductive structure including silicon while the SBL is not formed on the portions of the substrate and an insulating structure such as the field region and a spacer composed of insulation material without silicon. The SBL is removed after the silicidation process is completed. When the contact hole is formed to expose the portion of the active region having the silicide film thereon, a recess may be formed at the portion of the field region adjacent to the active region because the field region is relatively sensitive to the etching process for the formation of the contact hole. The recess may frequently have a depth of above 10 percent of that of the contact hole, thereby causing the damage to the substrate. Failure of the semiconductor device may occur because a current passing between the active region and the contact may leak through the damaged portion of the substrate. Further, in a semiconductor device having a design rule of below about 0.1 μm, the damage to the substrate becomes more serious at a shallow junction portion thereof so that the damaged portion of the substrate greatly serves as a leakage current source that can cause the device failure. When to prevent the formation of the recess in the field region, the etching process for the contact hole is insufficiently performed, the interlayer insulation film may partially remain in the active region and the contact hole may not be precisely formed on the active region. As a result, the contact formed in the contact hole may not be electrically contacted with the active region, thereby causing the electrical failure of the semiconductor device.

SUMMARY OF THE INVENTION

The present invention provides a method of manufacturing a semiconductor device and a semiconductor device that overcomes the above-described and other problems. The present invention provides a contact plug having an improved structure. The plug is formed using a silicidation blocking layer pattern.

Another feature of the present invention is to provide a method of manufacturing a semiconductor device including a contact plug having an improved structure using a silicidation blocking layer pattern enlarged from a field region to the portion of an active region without the damage of the field region of a semiconductor substrate.

In accordance with one aspect of the present invention, a silicidation blocking layer (SBL) pattern is formed on a substrate that includes an active region and a field region. The SBL pattern covers the field region and exposes the active region. A silicide layer is formed on the active region by reacting metal with silicon existing in the active region, and an insulation layer is formed on the substrate including the silicide layer. An opening exposing the silicide layer is formed through the insulation layer by selectively etching the insulation layer under a condition having an etching selectivity between the SBL pattern and the insulation layer. Then, a conductive material is filled up the opening to form a contact plug. The SBL pattern includes an oxide film and a nitride film. In addition, a conductive pattern may be formed between the SBL pattern and the substrate, and an etch stop layer may be formed on the silicide layer. Here, the etching selectivity between the SBL pattern and the insulation layer is above a ratio of about 1:10, and the silicide layer may include a cobalt silicide film.

In accordance with another aspect of the present invention, a silicidation blocking layer (SBL) pattern is formed on a substrate including an active region and a field region. The SBL pattern exposes a portion of the active region, covers the field region, and the silicidation blocking layer pattern extends from the field region to a portion of the active region adjacent to the field region. A silicide layer is formed on the active region by reacting metal with silicon existing in the active region, and an insulation layer is formed on the substrate including the silicide layer. An opening exposing the silicide layer is formed by selectively etching the insulation layer under a condition having an etching selectivity between the SBL pattern and the insulation layer. Conductive material is filled up the opening. Here, the extended portion of the silicidation blocking layer pattern has a width of below about 10 percent of the width of the active region.

According to the present invention, the SBL pattern is formed on the substrate from the field region of the substrate to the portion of the active region of the substrate. Because the SBL pattern covers the portion of the active region adjacent to the field region, the field region is not damaged when the mis-alignment of the contact hole may occur during the etching process for the formation of the contact hole. Here, the field region is sufficiently protected by the SBL pattern without any additional process. Accordingly, the failure of a semiconductor device is effectively prevented after forming a contact plug in the contact hole because the flow of a leakage current through the field region is blocked.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

Figure 1:
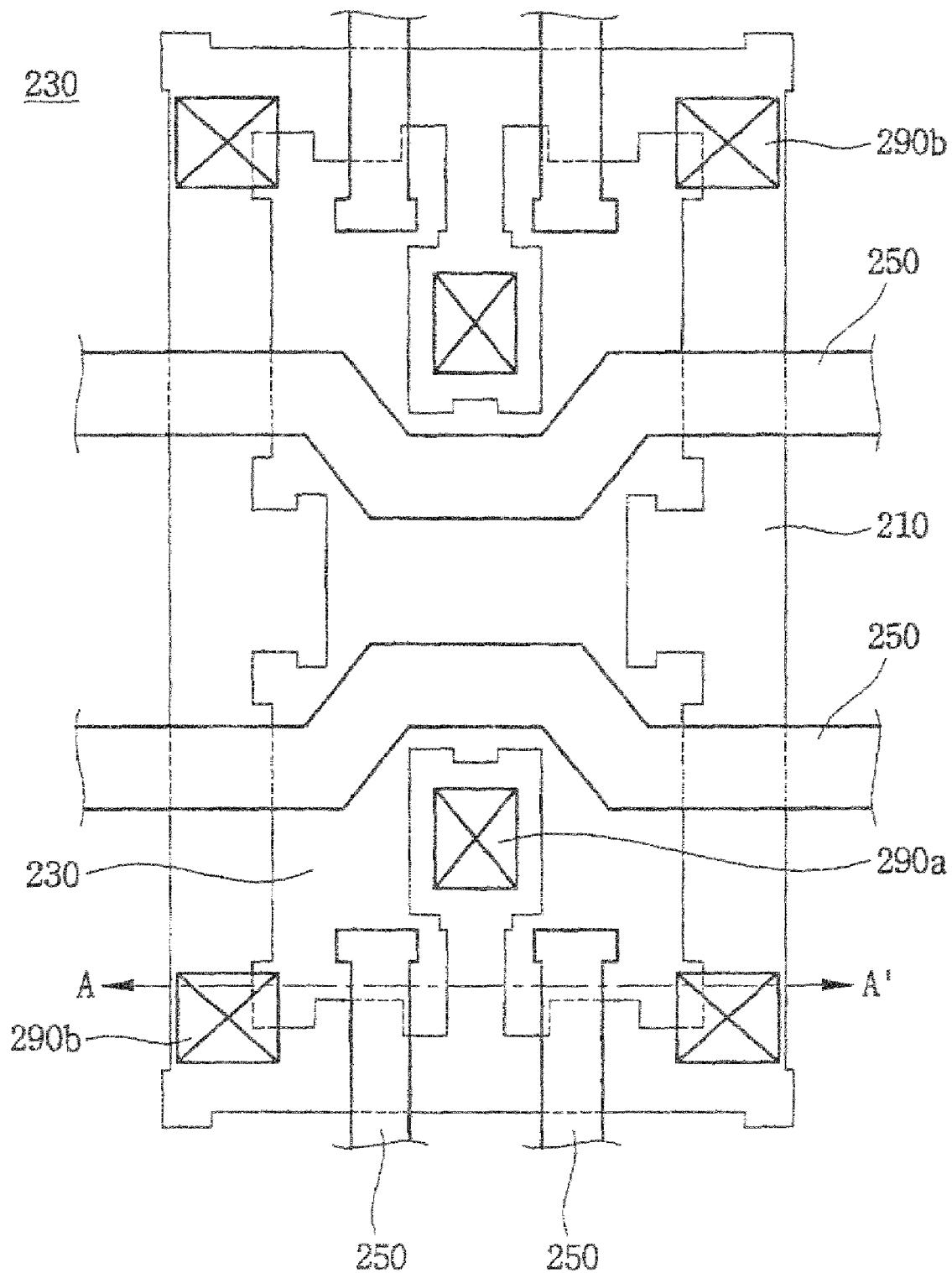
FIG. 1 is a plan view illustrating a semiconductor device according to one embodiment of the present invention.

The present invention now will be described more fully hereinafter with reference to the accompanying drawings, in which preferred embodiments of the present invention are shown. This invention may, however, be embodied in many different forms and should not be construed as limited to the embodiments set forth herein; rather, these embodiments are provided so that this disclosure will be through and complete, and will fully covey the scope of the present invention to those of ordinary skill in the art. In drawings, like reference characters refer to like element throughout.

In one embodiment of the present invention, a silicidation blocking layer (SBL) pattern is formed on a silicon substrate where an active region and a field region are defined. The SBL pattern covers the field region whereas the SBL pattern exposes the active region. Here, the SBL pattern has a double layer structure or a single layer structure. That is, the SBL pattern includes an oxide film pattern and a nitride film pattern. Alternatively, the SBL pattern may include one oxide film pattern or one nitride film pattern. Further, a conductive film pattern may be formed between the SBL pattern and the silicon substrate.

A silicide film is formed on the exposed portion of the active region by reacting metal such as titanium, cobalt or nickel with the silicon of the exposed portion of the active region. In addition, the silicide film may be formed on the conductive pattern when the conductive pattern includes silicon therein. Preferably, the silicide film includes cobalt silicide. Alternatively, an etch stop layer may be formed on the silicide film.

An insulation film is formed on the resultant structure having the silicide film. The insulation film is selectively etched to form an opening exposing the upper face of the silicide film. Here, the insulation film is etched under etching conditions in which the insulation film is more rapidly etched than the SBL pattern. The etching selectivity of the SBL pattern relative to the insulation film is preferably above a ratio of about 1:10.

A conductive film is formed on the insulation film to fill the opening formed through the insulation film so that a contact plug that electrically contacts with the active region is formed in the opening corresponding to a contact hole.

In another embodiment of the present invention, an SBL pattern is formed on a silicon substrate where an active region and a field region are defined. Here, the SBL pattern covers the field region and the portion of the active region whereas the SBL pattern exposes the first portion of the active region. That is, the SBL pattern extends from the field region to the portion of the active region adjacent to the first portion of the active region. The extended portion of the SBL pattern has a width of below about 10 percent of the width of the active region. The SBL pattern includes an oxide film pattern and a nitride film pattern. Alternatively, the SBL pattern may include an oxide film pattern or a nitride film pattern. Additionally, a conductive pattern may be formed between the SBL pattern and the silicon substrate.

A silicide film is formed on the first portion of the active region by reacting metal with the silicon existing at the first portion of the active region. Additionally, the silicide film may be formed on the conductive pattern when the conductive pattern includes silicon. The silicide film preferably includes cobalt silicide. Alternatively, an etch stop layer may be formed on the silicide film.

After an insulation film is formed on the resultant structure including the silicide film, the insulation film is selectively etched to form an opening that exposes the silicide film. Here, the etching selectivity between the SBL pattern and the insulation film is above about 1:10.

A conductive film is formed on the insulation film to fill the opening formed through the insulation film, thereby forming a contact plug making electrical contact with the first portion of the active region in the opening.

Hereinafter, preferred embodiments of the invention will be described with reference to the accompanying drawings.

FIG. 1 is a plan view illustrating a semiconductor device according to one embodiment of the present invention.

Referring to FIG. 1, a semiconductor substrate is divided into an active region 210 and a field region 230 by an isolation process such as a local oxidation of silicon (LOCOS) process or a shallow trench isolation (STI) process. A plurality of gate lines 250 are formed on the active and field regions 210 and 230, which serve as conductive wirings of a semiconductor device. To electrically contact the active region 210 with the conductive wirings such as the gate lines 250 formed on the active and field regions 210 and 230, a plurality of contact plugs 290a and 290b are generally formed on the active region 210. Here, most of the contact plugs 290a and 290b are positioned in the active region 210, however, a few contact plugs may be formed in the field region 230 because the areas of the substrate provided for the contact plugs are very minute in accordance with the reduction of the design rule of the semiconductor device. In addition, the contact plugs are purposely formed in the active region and in the portion of the field region adjacent to the active region to ensure a processing margin for the contact plug. That is, the semiconductor device may include the contact plugs 290a and 290b formed from the active region to the field region as occasion demands.

Figure 2:
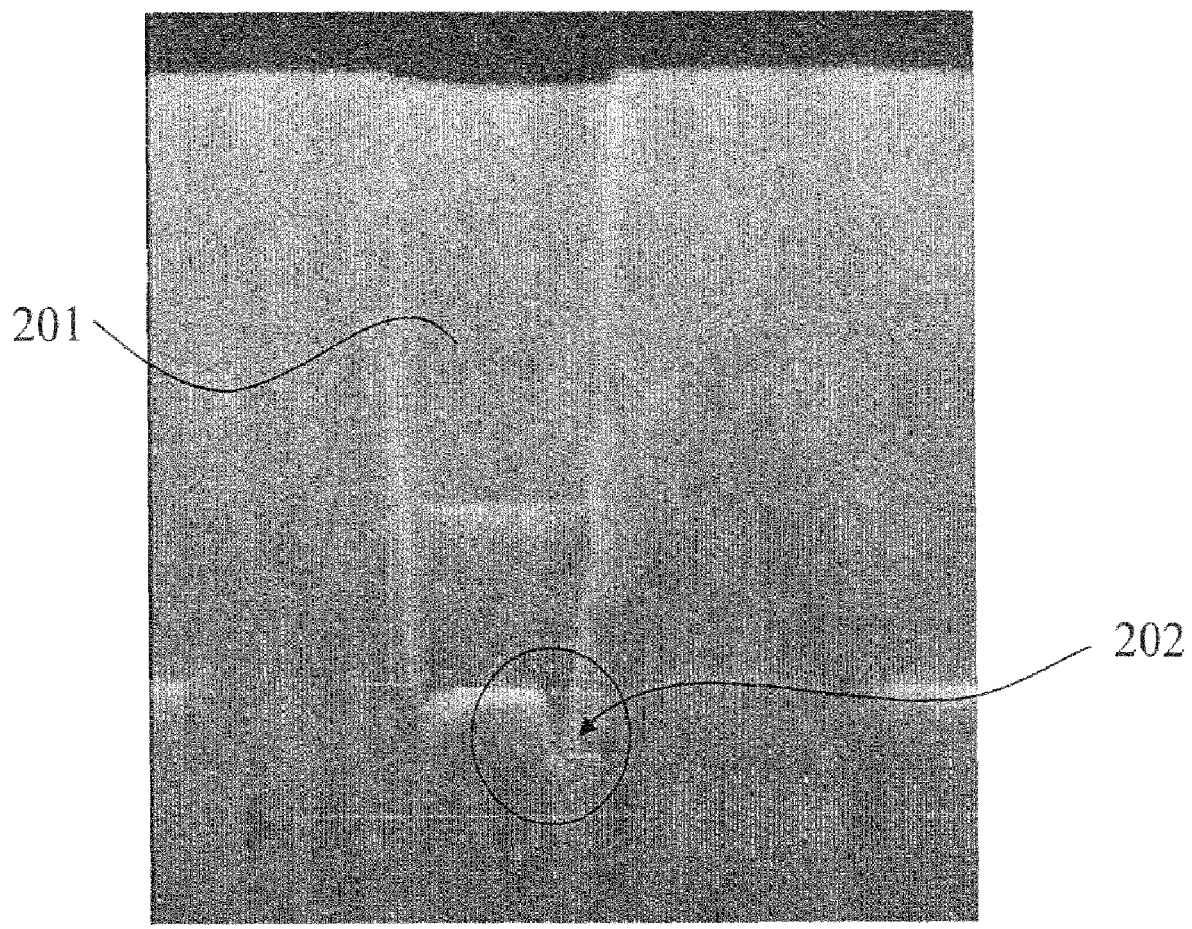
FIG. 2 is an electron microscopic photograph illustrating a semiconductor device having the contact plug.

FIG. 2 is an electron microscopic photograph illustrating a semiconductor device having the contact plug.

Referring to FIG. 2, when a silicide layer is formed by the conventional silicidation process for forming the contact plug, a recess 202 may be formed in a field region of a substrate because the field region adjacent to an active region is easily etched during the formation of contact holes 201 in the active and field regions although the etching process is identically performed on the active and field regions. The recess 202 may be formed to have a deep depth of about 10 percent of that of the contact hole 201. When the substrate is impaired due to the deep recess, a failure of a semiconductor device may occur because a current flowing between a contact and the active region may leak toward the impaired portion of the substrate. As for a semiconductor device having a design rule of below about 0.1 μm, the damage of the substrate may increase at a shallow junction portion of the substrate, which serves a more serious leakage current source.

FIGS. 3A to 3H are cross-sectional views taken along line of A-A' in FIG. 1, which illustrate a method of manufacturing the semiconductor device according to one embodiment of the present invention.

Figure 3A:
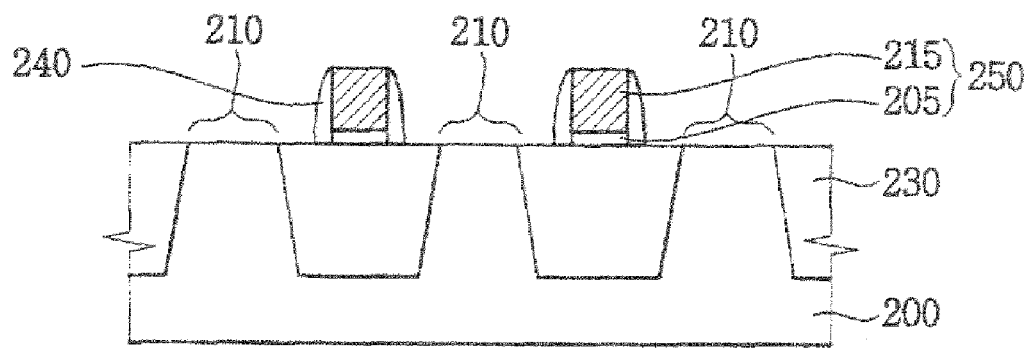
FIGS. 3A to 3H are cross-sectional views taken along line of A-A' in FIG. 1 illustrating a method of manufacturing the semiconductor device according to one embodiment of the present invention.

Referring to FIG. 3A, after a trench is formed in a substrate 200 using a shallow trench isolation (STI) process, a field region 230 is defined on the substrate 200 by filling the trench with an oxide film. As the field region 230 is formed on the substrate 200, a plurality of active regions 210 are defined on the substrate 200 by the formation of the field region 230.

After an oxide film is formed on the substrate 200 including the active and field regions 210 and 230, a polysilicon film is formed on the oxide film. The polysilicon film is doped using N type impurities to have a high impurity concentration. Then, the doped polysilicon film and the oxide film are patterned using a photolithography process to thereby form a gate electrode 250 having a doped polysilicon film pattern 215 and a gate oxide film 205 on the substrate 200.

Source/drain regions (not shown) are formed on the portions of the substrate 200 adjacent to the gate electrode 250 using an ion implanting process.

After an insulation film including silicon oxide or silicon nitride is formed on the gate electrode 250 and on the substrate 200, the insulation film is anisotropically etched to form a gate spacer 240 on the sidewall of the gate electrode 250.

Figure 3B:
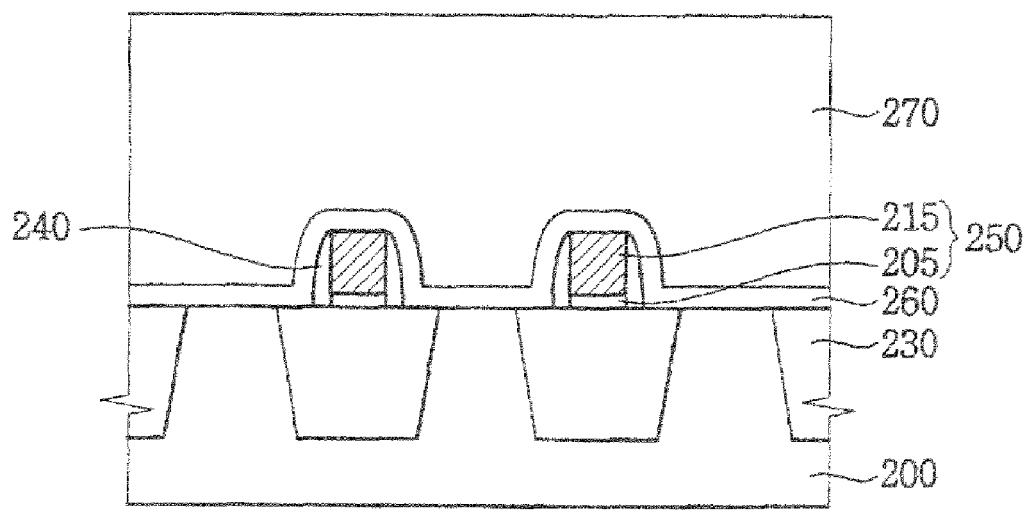

Referring to FIG. 3B, an oxide film is formed on the gate electrode 250 including the gate spacer 240 and on the substrate 200, and then a nitride film is formed on the oxide film so that a silicidation blocking layer (SBL) 260 is formed on the gate electrode 250 and on the substrate 200. The SBL 260 has a double layer structure including an oxide film and a nitride film. Alternatively, the SBL 260 may include a single layer structure of an oxide film or a nitride film. A photoresist film 270 is formed on the SBL 260.

Figure 3C:
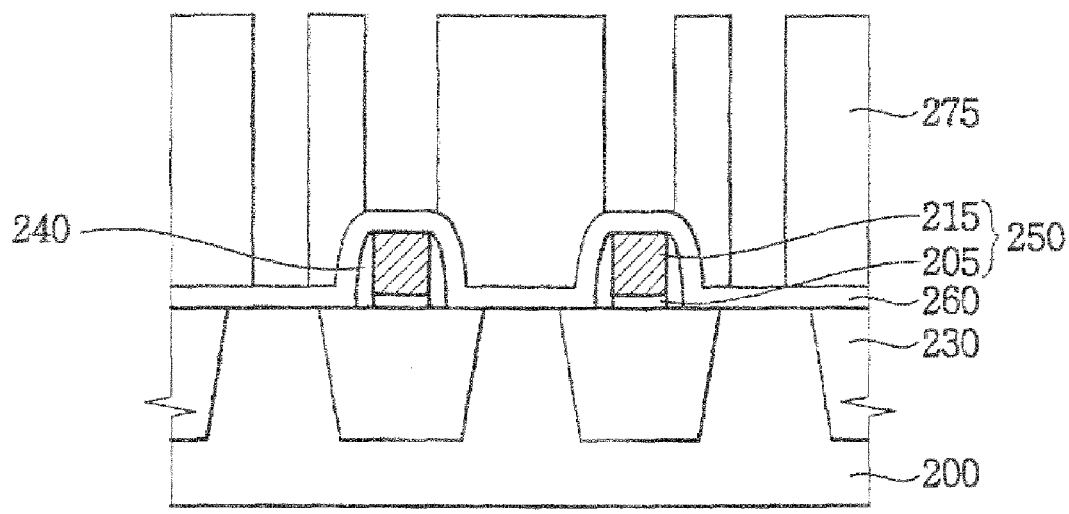

Referring to FIG. 3C, the photoresist film 270 is exposed and developed to form a photoresist pattern 275 on the SBL 260. The photoresist pattern 275 exposes the portion of the active region 210 and the portion of the SBL 260 positioned on the gate electrode 250, whereas the photoresist pattern 275 covers the field region 230 and the portion of the substrate 200 where the SBL 260 is not formed. Here, the photoresist pattern 275 is extended from the gate spacer 240 to the portion of the active region 210 adjacent to the exposed portion of the active region 210. That is, the photoresist pattern 275 partially covers the active region 210 adjacent to the field region 230. In one embodiment of the invention, the photoresist film 270 is patterned to form the photoresist pattern 275 exposing the portions of the SBL 260 that will be removed in a successive process. For example, when a positive photoresist is employed for the photoresist film 270, the exposed portions of the photoresist film 270 by a photo mask in the exposure process are removed. On the other hand, the portions of the photoresist film 270 covered with the photo mask are removed to form the photoresist pattern 275 when a negative photoresist is used for the photoresist film 270. In any case, since the construction of the photoresist pattern 275 is determined in accordance with the exposure process performed on the photoresist film 270, the photo mask should be precisely aligned over the photoresist film 270 to expose the photoresist film 270. However, the photoresist pattern 275 may not have a demanded construction after the exposure and developing processes because a processing margin for the alignment of the photo mask may be reduced according as the design rule on a semiconductor device is diminished. Particularly, the mis-alignment of the photo mask may frequently occur concerning the portions of the active region 210 adjacent to the field region 230, thereby causing the failure of the semiconductor device described above.

Figure 3D:
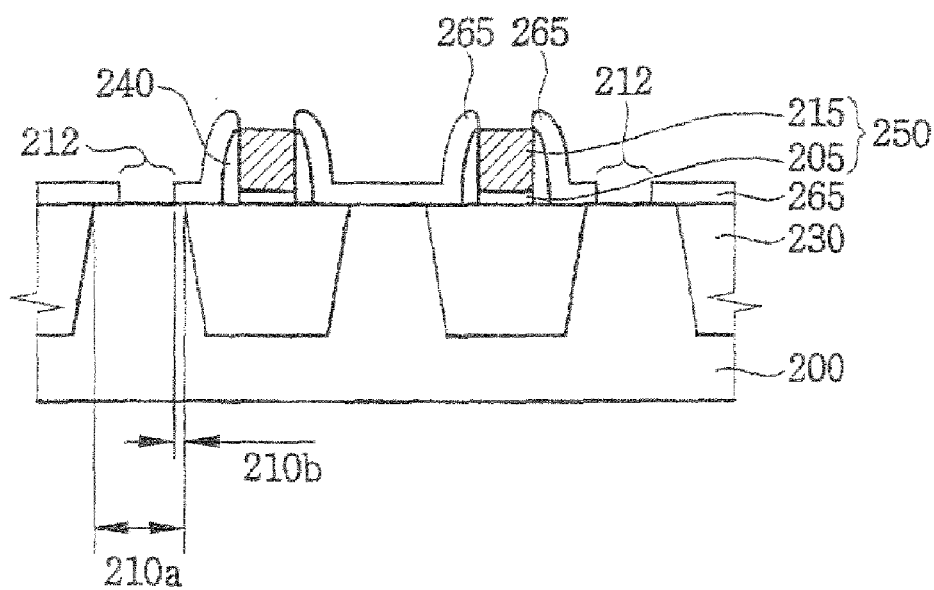

Referring to FIG. 3D, after the exposed portion of the silicidation layer 260 is removed using the photoresist pattern 275 as an etching mask, the photoresist pattern 275 is removed by an ashing and stripping process. Accordingly, a silicidation blocking layer (SBL) pattern 265 is formed on the portions of the substrate 200 and on the gate spacer 240 of the gate electrode 250. The SBL pattern 265 exposes the upper face of the gate electrode 250 and the first portion 212 of the active region 210. Here, the SBL pattern 265 is extended from the gate spacer 240 to the portion the active region 210 adjacent to the field region 230 so that the SBL pattern 265 exposes the first portion 212 of the active region 210 and covers other portions of the active region 210 besides the first portion 212. The width 210b of the extended portion of the SBL pattern 265, that exposes the first portion 212 of the active region 210, is preferably below about 10 percent of the entire width 210a of the active region 210. When the width 210b of the extended portion of the SBL pattern 265 exceeds about 10 percent of the width 21Oa of the active region 210, the SBL pattern 265 considerably occupies the active region 210 so that the active region 210 may not contact a contact plug 290b (see FIG. 3H) formed later.

In one embodiment of the invention, the SBL pattern 265 may be formed to cover the field region 230 and the gate spacer 240 only, thereby ensuring the processing margins of successive processes.

Figure 3E:
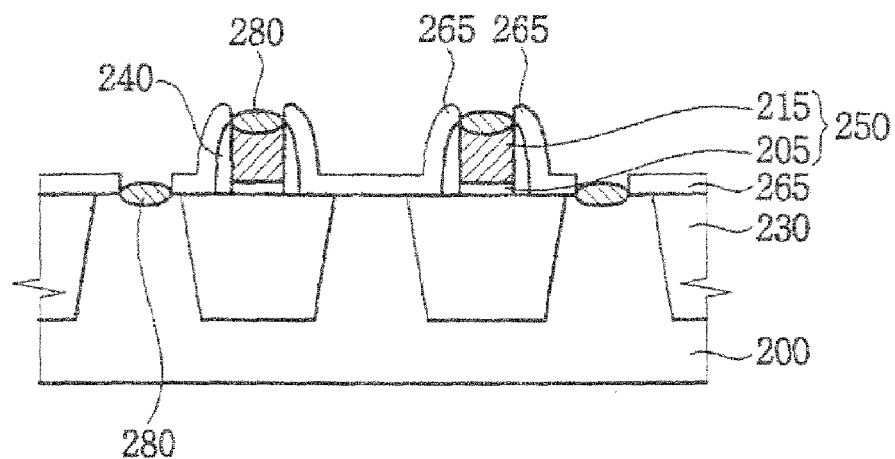

Referring to FIG. 3E, after a wet cleaning process is performed on the substrate 200 to remove minute particles, metallic impurities, organic contaminants and a native oxide film formed on the substrate 200 including the resultant structure, the substrate 200 is loaded into a radio frequency (RF) sputter. In the RF sputter, an RF plasma etching process is performed on the substrate 200 to remove a native oxide film that may be formed on the substrate 200 during the transfer of the substrate 200, or to improve the morphology of the substrate 200 including the resultant structure. Then, a cobalt (Co) film is formed on the substrate 200 in situ by a sputtering process in the RF sputter. The substrate 200 including the cobalt film formed thereon is thermally treated using a rapid thermal process (RTP) so that a cobalt silicide film 280 is formed on the first portion of the active region 210 and on the exposed gate electrode 250. That is, the cobalt silicide film 280 is formed on the first portion of the active region 210 exposed by the SBL pattern 265, and the cobalt silicide film 280 is formed on the gate electrode 250 exposed by the SBL pattern 265. The cobalt silicide film 280 is formed in accordance with the reaction between the cobalt film and the silicon in the active region 210 and the gate electrode 250. Here, the cobalt silicide film 280 is not formed on the SBL pattern 265 because the SBL pattern 265 covers the silicon existing at the portions of the active and field regions 210 and 230. Thus, un-reacted cobalt remains on the SBL pattern 265. After the formation of the cobalt silicide film 280, the remaining cobalt is removed from the SBL pattern 265.

Figure 3F:
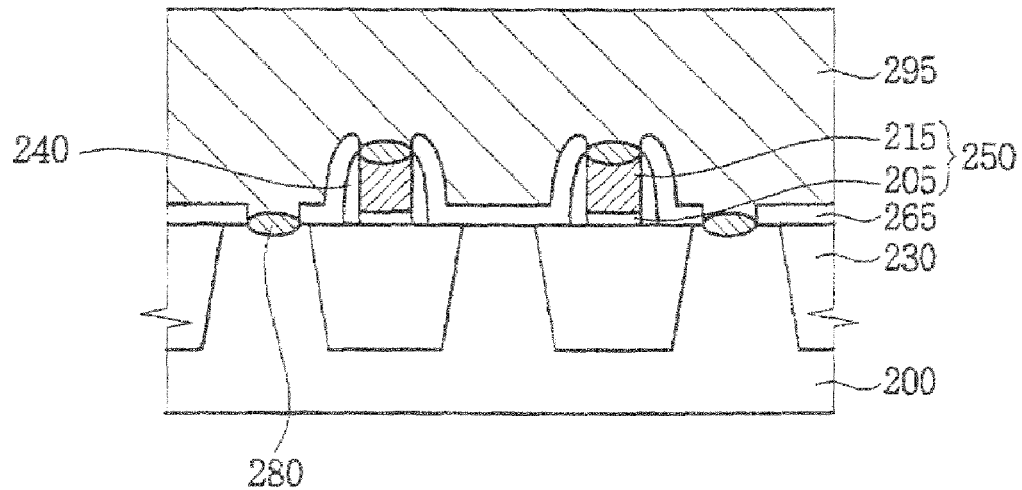

Referring to FIG. 3F, an interlayer insulation film 295 is formed on the resultant structure including the cobalt silicide film 280 by depositing insulation material on the resultant structure, the interlayer insulation film 295 is planarized by a chemical mechanical polishing (CMP) process or an etch-back process. In one embodiment, an etch stop film may be formed on the cobalt silicide film 280 to prevent the resultant structure from damaging when a contact hole will be formed in a successive process. Here, the etch stop film includes silicon nitride (SiN) or silicon oxynitride (SiON).

Figure 3G:
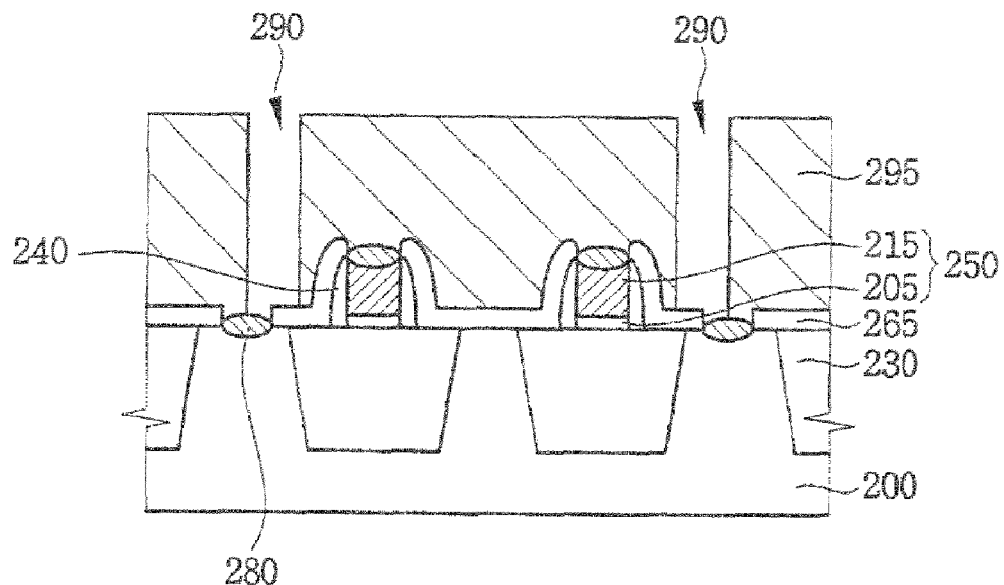

Referring to FIG. 3G, a photoresist film (not shown) is formed on the interlayer insulation film 295, and then the photoresist film is exposed and developed to form a photoresist pattern (not shown) on the interlayer insulation film 295. The photoresist pattern partially exposes the interlayer insulation film 295. The exposed portion of the interlayer insulation film 295 is etched using the photoresist pattern as an etching mask to thereby form a contact hole 290 through the interlayer insulation film 295. Preferably, the contact hole 290 is formed by a dry etch etching process so that the contact hole 290 has a vertical profile.

In general, an etching process for forming contact holes is somewhat excessively performed in order to complete a formation of the contact holes exposing the contact regions of a substrate. When the contact regions are not completely exposed through the contact holes, a contact failure may be incurred to cause the failure of a semiconductor device. Accordingly, the contact holes are formed from an active region to a field region in accordance with the insufficient alignment margin for the contact hole or as occasion demands, the field region may be easily etched that the active region during the formation of the contact hole to thereby cause the damage of the field region. When the etching selectivity between interlayer insulation layer 295 and the SBL pattern 265 is below about 10:1, the field region 230 may be impaired because the SBL pattern 265 is removed during the etching process for forming the contact hole 290. If the field region 230 is damaged during the formation of the contact hole 290, the current flowing from the contact plug 290b to the contact portion of the active region 210 (that is, the source/drain region) may leak through the damaged portion of the field region 230 after the contact plug 290b is formed in the contact hole 290. As a result, the failure of the semiconductor device or the mis-operation of the semiconductor device may occur. In the present invention, since the interlayer insulation film 295 has the etching selectivity of above a ration of about 10:1 relative to the SBL pattern 265, the interlayer insulation film 295 is rapidly etched comparing to the SBL pattern 265 without damaging the field region 230 when the contact hole 290 is formed through the interlayer insulation film 295. Alternatively, the etching selectively between the interlayer insulation film 296 and the SBL pattern 265 may be above a ratio of about 15:1 in order to complete the contact hole 290 formation without any damaging of the field region 230. As a result, when the contact hole 290 is formed from the active region 210 to the field region 230, the SBL pattern 265 serves as en etch stop layer that protects the easily etched portion of the substrate 200 while the contact hole 290 exposing the contact portion of the active region 210 is completely formed through the interlayer insulation film 295.

Figure 3H:
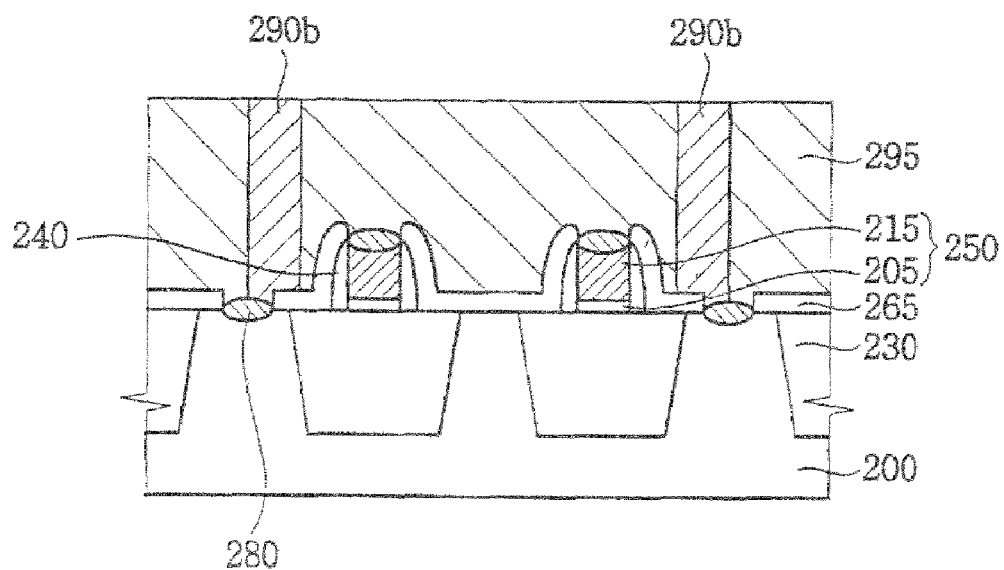

Referring to FIG. 3H, a conductive film is formed on the interlayer insulation film 295 to fill the contact hole 290. The conductive film is planarized by a CMP process or an etch-back process until the upper face of the interlayer insulation film 295 is exposed. As a result, a contact plug 290b is formed in the contact hole 290.

According to the present invention, an SBL pattern is formed on a substrate from the field region of the substrate to the portion of the active region of the substrate. Because the SBL pattern covers the portion of the active region adjacent to the field region, the field region is not damaged when the mis-alignment of a contact hole may occur during the etching process for the formation of the contact hole. Here, the field region is sufficiently protected by the SBL pattern without any additional process. Accordingly, the failure of a semiconductor device is effectively prevented after forming a contact plug in the contact hole because the flow of a leakage current through the field region is blocked.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A semiconductor device including:
   a substrate having an active region and a field region;
   a silicidation blocking layer covering the field region and exposing the active region, the silicidation blocking layer including an extended portion covering a portion of the active region, wherein the extended portion of the silicidation blocking layer has a width of below about 10 percent of a width of the active region;
   a silicide layer on the active region, the silicide layer being formed by reacting metal with silicon existing in the active region;
   an insulation layer covering the silicidation blocking layer and having an opening exposing the silicide layer; and
   a conductive material in the opening to make contact with the silicide layer.

2. A semiconductor device formed by a method comprising:
   forming a silicidation blocking layer pattern on a substrate including an active region and a field region, wherein the silicidation blocking layer pattern covers the field region and exposes a portion of the active region, wherein the exposed portion of the active region has a width of above about 90 percent of a width of the active region;

forming a silicide layer on the active region by reacting metal with silicon existing in the active region;

forming an insulation layer on the substrate including the silicide layer;

selectively etching the insulation layer to form an opening exposing the silicide layer under a condition having an etching selectivity between the silicidation blocking layer pattern and the insulation layer; and forming a conductive material to fill the opening.

3. The semiconductor device of claim 2, wherein the silicidation blocking layer pattern includes an oxide film and a nitride film.

4. The semiconductor device of claim 2, further comprising forming a conductive pattern between the silicidation blocking layer pattern and the substrate.

5. The semiconductor device of claim 2, further comprising forming an etch stop layer on the silicide layer.

6. The semiconductor device of claim 2, wherein the etching selectivity between the silicidation blocking layer pattern and the insulation layer is above a ratio of about 1:10.

7. The semiconductor device of claim 2, wherein the silicide layer includes a cobalt silicide film.

8. The semiconductor device of claim 1, wherein the silicidation blocking layer pattern includes an oxide film and a nitride film.

9. The semiconductor device of claim 1, further comprising a conductive pattern formed between the silicidation blocking layer pattern and the substrate.

10. The semiconductor device of claim 1, further comprising an etch stop layer formed on the suicide layer.

11. The semiconductor device of claim 1, wherein an etching selectivity between the silicidation blocking layer and the insulation layer is above a ratio of about 1:10.

12. The semiconductor device of claim 1, wherein the silicide layer includes a cobalt silicide film.

* * * * *

UNITED STATES PATENT AND TRADEMARK OFFICE
CERTIFICATE OF CORRECTION

| | | |
|---|---|---|
| PATENT NO. | : 7,476,973 B2 | Page 1 of 1 |
| APPLICATION NO. | : 11/754248 | |
| DATED | : January 13, 2009 | |
| INVENTOR(S) | : Hyeon-Cheol Kim | |

It is certified that error appears in the above-identified patent and that said Letters Patent is hereby corrected as shown below:

Title Page;
Foreign Application Priority Data, Section (30), the date "Jan. 3, 2003" should read -- Feb. 3, 2003 --;
Column 6, line 58, the word "21Oa" should read -- 210a --;
Column 10, line 13, the word "suicide" should read -- silicide --.

Signed and Sealed this

Eighth Day of December, 2009

David J. Kappos
*Director of the United States Patent and Trademark Office*